United States Patent [19]
Setbacken et al.

[11] Patent Number: 5,920,494
[45] Date of Patent: Jul. 6, 1999

[54] METHOD AND DEVICE FOR VARYING INTERPOLATION FACTORS

[75] Inventors: Robert Setbacken, Santa Barbara, Calif.; Mark Mazgaj, Lakewood, N.Y.

[73] Assignee: Renco Encoders, Inc., Goleta, Calif.

[21] Appl. No.: 08/782,050

[22] Filed: Jan. 10, 1997

[51] Int. Cl.[6] ....................................................... G01B 7/02
[52] U.S. Cl. .............................. 364/723; 702/150; 377/3; 377/50
[58] Field of Search ..................................... 364/577, 525, 364/559, 723; 702/150; 377/3, 50

[56] References Cited

U.S. PATENT DOCUMENTS

| | | | |
|---|---|---|---|
| 4,225,931 | 9/1980 | Schwefel | 364/577 |
| 4,595,991 | 6/1986 | Spies | 364/525 |
| 4,630,928 | 12/1986 | Klinger et al. | 356/374 |

FOREIGN PATENT DOCUMENTS 288221  3/1991  Germany .

*Primary Examiner*—John Barlow
*Assistant Examiner*—Hien Vo
*Attorney, Agent, or Firm*—Brinks Hofer Gilson & Lione

[57] ABSTRACT

A method and device for varying interpolation factor of at least one position-dependent, periodic signal in a position measurement system. The method and device allows switching between one of a specified number of different interpolation factors at a switching time point at which the interpolated measurement signal has an identical signal form for every possible interpolation factor.

33 Claims, 3 Drawing Sheets

5,920,494

METHOD AND DEVICE FOR VARYING INTERPOLATION FACTORS

FIELD OF THE INVENTION

The present invention relates to a method and device for varying interpolation factors. The method and device according to the present invention are especially suitable for switching between the various specified interpolation factors of a position measurement system during measurement operation.

BACKGROUND OF THE INVENTION

The known way incremental position measurement systems normally increase the resolution specified by the period of a sampled grating pitch is by interpolating the resulting periodic signals. For this purpose, the periodic sampling signals are fed to downstream interpolation electronics, where the sampling frequency is multiplied and the measuring steps are thereby subdivided. A series of procedures and devices, with which further subdivision of the original measuring steps is possible, are known for analog interpolation. Digital interpolation procedures allow high signal subdivision up to a subdivision factor of several thousand.

A disadvantage of known incremental position measurement systems and their downstream interpolation electronics, as a rule, is that they have a fixed interpolation factor. Their interpolation electronics do not have the capability of making a targeted change in the interpolation factor once it has been set. Further, the interpolation factor cannot be varied during measurement operation itself.

However, German Patent Publication No. DD 288 221 and U.S. Pat. No. 4,630,928 suggest changing the interpolation factor as a function of the traversing speed of the parts moving relative to one another, in order to vary the factor as a function of speed between a coarse and a fine degree of resolution. This means that in the case of fast traversing speeds, a smaller interpolation factor would be used, while in the case of slower traversing speeds, higher interpolation factors can be selected. For this purpose, U.S. Pat. No. 4,630,928 proposes to make output signals or interpolation signals constantly available, which correspond to larger or smaller interpolation factors. Depending on the speed provided, one of the two signals is suppressed and the other output signal is always used for evaluation. The arrangement disclosed in German Patent Publication No. DD 288 211 processes the analog sampling signals according to the traversing speed through a higher-or lower grade counting module, so that either coarse or fine resolution output signals result.

Such arrangements to vary the interpolation factor are limited to switching between two discrete interpolation factors. However, it is desirable to provide several switchable interpolation factors, which can be alternately switched between during measurement operation. The two patent publications described do not disclose any information about this. In particular, the publications do not address how reliable signal processing can be ensured when switching between various interpolation factors during measurement operation.

Therefore, it is desirable to provide a method as well as a device to vary the interpolation factor in an incremental position measurement system during measurement operation. It is also desirable to provide several switchable interpolation factors and reliable signal processing so that position information is not lost during switching.

SUMMARY OF THE PRESENT INVENTION

The method and device according to the present invention make it possible to switch between a series of specified interpolation factors during measurement operation of an incremental position measurement system. In the method, the measures according to the present invention ensure that the switching can be done safely, i.e., without possible loss of information. In particular, possible counting module errors are avoided during switching. Because of the proposed signal processing, the evaluation unit, which is downstream from the device, always has information available to it concerning the selected interpolation factor and possible changes in it.

The method according to the present invention makes it possible to select the interpolation factor of a position measurement system as a function of speed. For example, at relatively high speeds of two parts moving relative to one another, a smaller interpolation factor can be selected, and at relatively low speeds, a higher interpolation factor can be selected. Several interpolation factors of different magnitudes can be selected for different ranges of speed. Thus, it is possible to provide both speed-dependent switching between the different interpolation factors. This increases measurement accuracy in the determination of position.

DETAILED DESCRIPTION OF THE PRESENTLY PREFERRED EMBODIMENTS

Figure 1:
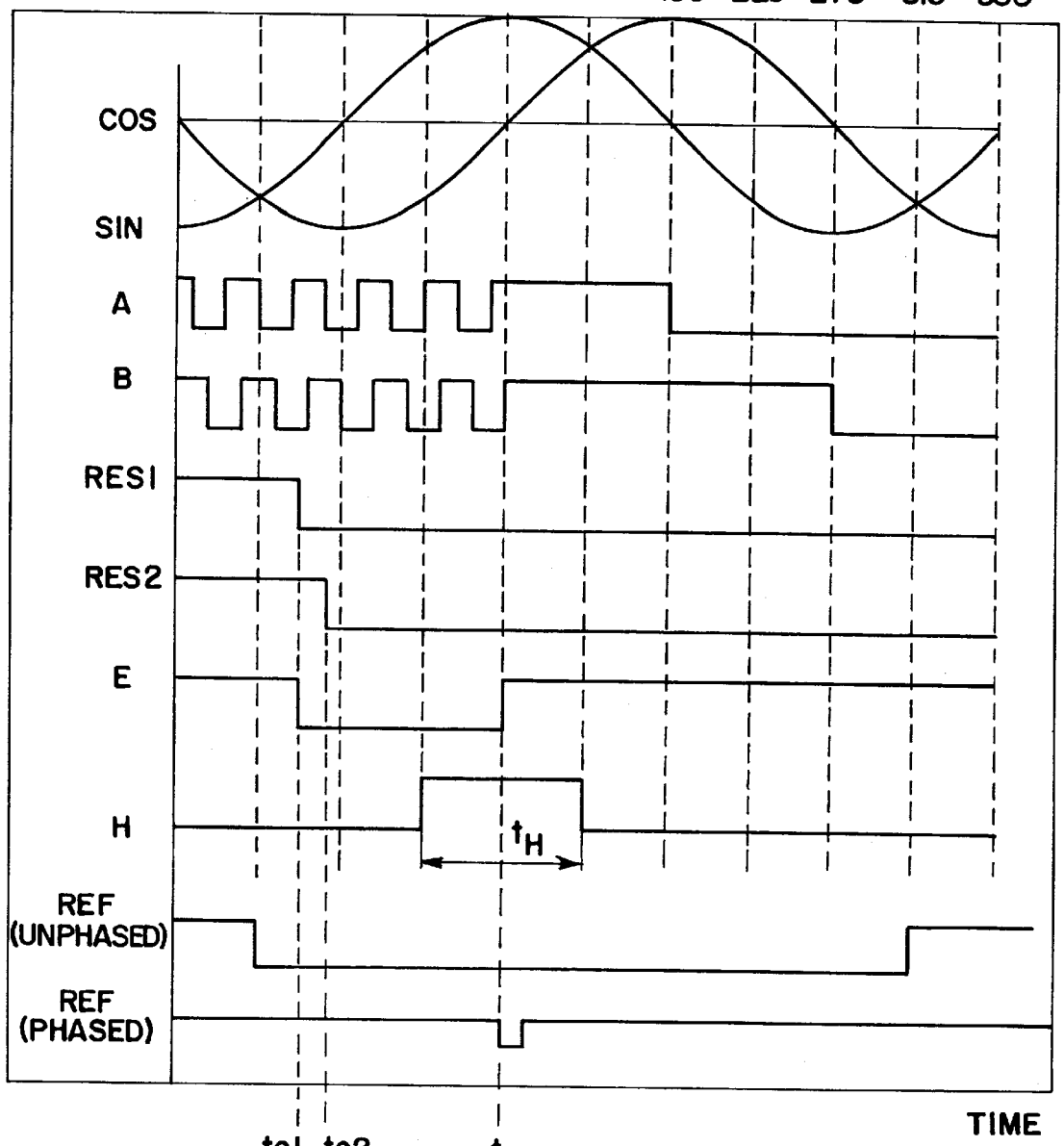
FIG. 1 is a graphical representation of signal processing during switching from an interpolation factor of I=10X to an interpolation factor of I=1X in accordance with the present invention.

FIG. 1 illustrates a representation of signal processing during switching between interpolation factors I=10X and I=1X. Time t is plotted on the horizontal axis. The graph illustrates the sequence in time of several individual signals, as they result, for example, during switching between the interpolation factors I=10X and I=1X.

With reference to FIG. 1, a preferred embodiment of the procedure according to the present invention will now be described. A signal creation unit 10 (shown in FIG. 3) creates two position-dependent, analog, and periodic signals SIN and COS. The two analog sampling signals SIN and COS, which are 90° out of phase, capture the direction and relative motion of two objects moving relative to one another. In principle, incremental position measurement without detection of direction would require only a single position-dependent periodic signal, which can also be interpolated. Therefore, the method according to the present invention can also be used when only a single periodic analog signal is present.

Figure 3:
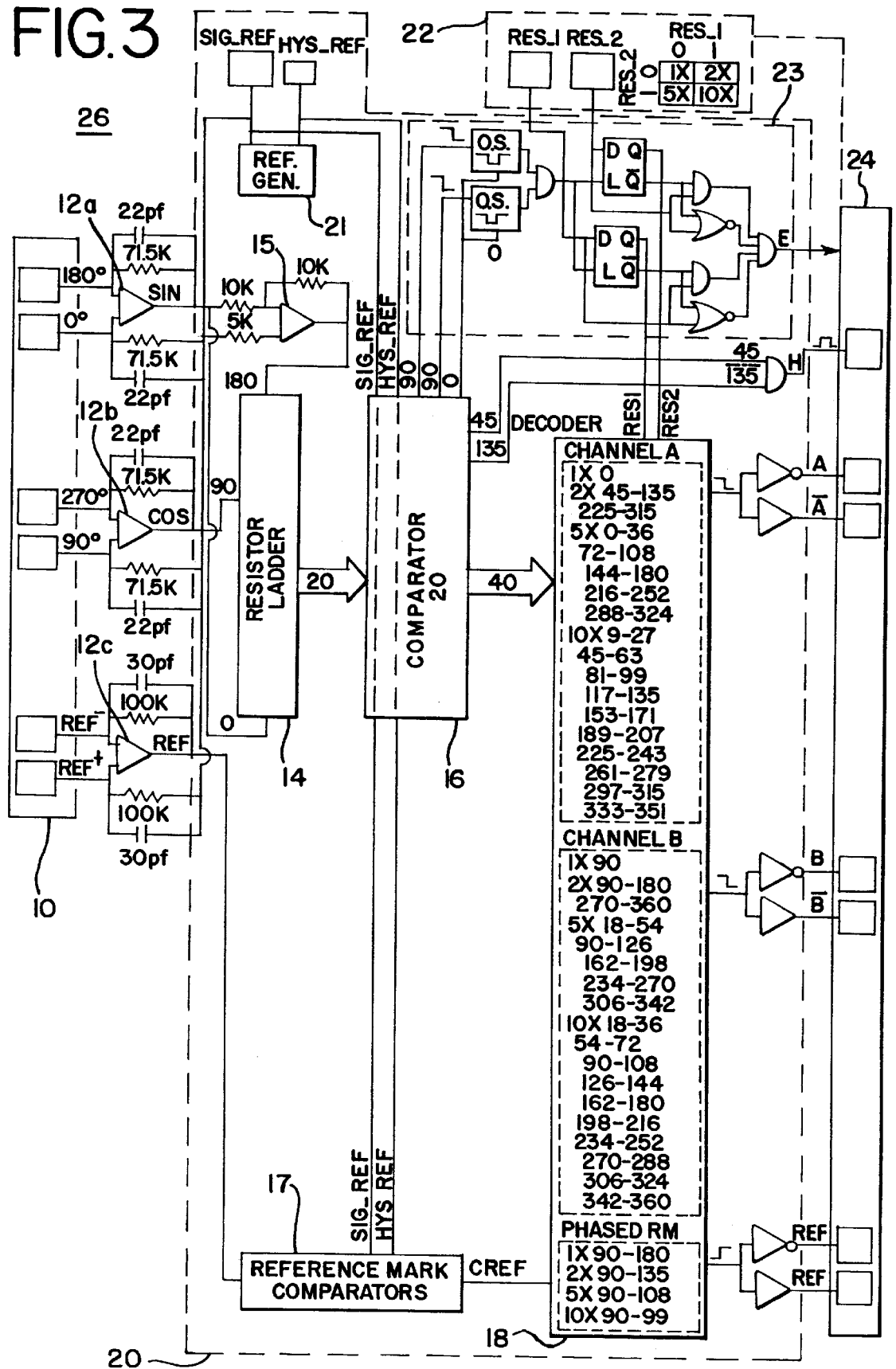
FIG. 3 is a schematic block diagram of a device according to a preferred embodiment of the present invention.

The position measurement system can also include a reference mark, REF (shown in FIG. 3). REF can be phased or unphased depending on the application. An analog phased reference mark is a signal which is active for normally one cycle width and positioned or phased relative to the incremental channel (0° and 90°). An analog unphased reference mark is a signal which can be active for one to several cycles long and is not positioned relative to the incremental channels. For rotary devices, the reference mark can be a once per revolution signal indicating that a full rotation has been traversed. For linear devices, the mark can be a single signal provided at a particular point in the traversal, or a distance coded set of marks. The implementation and the use of reference marks are well understood in the art. When present, the phased reference mark can be conditioned by the present invention such that it remains one count cycle in width for all interpolation factors.

The signal creation unit 10 (shown in FIG. 3) is made in a known manner, for example, as a sampling unit of a photoelectric position measurement device, with which a periodic grating pitch is sampled. For this purpose the sampling unit contains detector elements whose outputs have one or several locus-dependent, periodically modulated analog sampling signals. For instance, it is a known procedure to create a total of four signals which are 90° out of phase, from which the two sampling signals SIN and COS, which are 90° out of phase, are formed by pair-wise differential connection. Of course, the position measurement system can be implemented both as a linear measurement system and as an angular position measurement system.

The incremental measurement signals created from the analog SIN and COS sampling signals by the processing unit 20 (FIG. 3) of the device according to the present invention, which will be described later, are routed through two output channels A and B to a downstream evaluation unit 24 (FIG. 3). The sampling signals SIN and COS from the signal creation unit 10 (FIG. 3) are subdivided with a defined interpolation factor. In the example shown in FIG. 1, an interpolation factor of I=10X is provided in the left half of the graph. Thus, the two resulting output channels A and B have rectangular pulses that correspond to a ten-fold subdivision of the original signal period of the analog sampling signals SIN and COS.

At a switching time point $t_u$, which corresponds to a zero transition of one of the two analog sampling signals SIN or COS, the original interpolation device I=10X is switched to an interpolation factor I=1X. In the example shown in FIG. 1, $t_u$ is at a zero transition of the COS sampling signal. Therefore, within each signal period of the analog sampling signals, SIN or COS, there is a defined switching time point $t_u$ at which it is possible to change between different specified interpolation factors I. In the implementation shown in FIG. 1 with the possibility of switching between interpolation factors I=1, 2, 5, and 10, the switching time point $t_u$ is selected so that it displays the phase angle $\Phi=90°$ at the beginning of the signal period, i.e., $\Phi=0°$ is defined as the first zero transition of the SIN sampling signal. Therefore, at the switching time point $t_u$ the interpolated, incremental measurement signal in output channel B has a rising signal edge, during which the logical signal level changes from LOW to HIGH.

Figure 2:
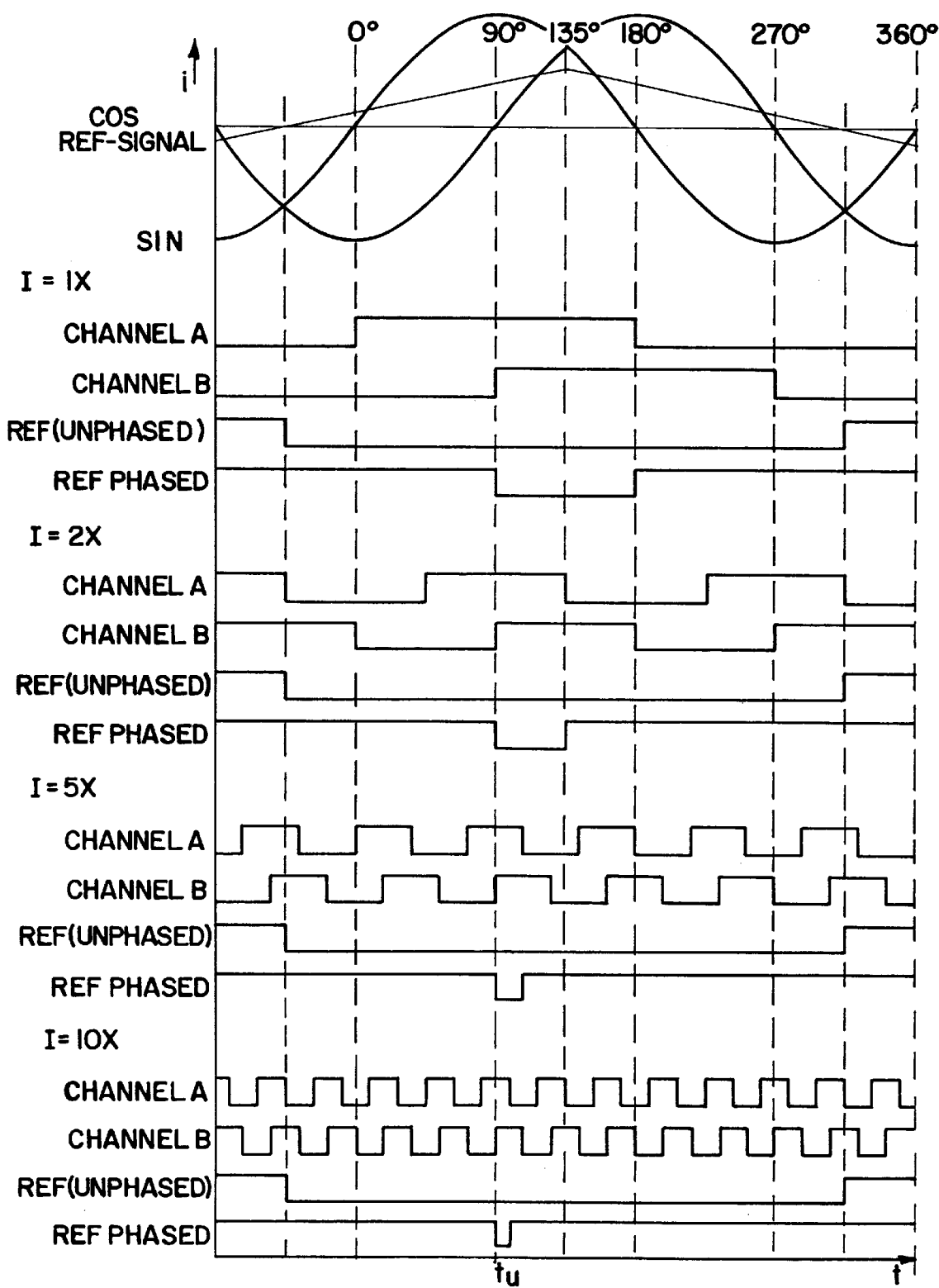
FIG. 2 is a graphical representation of the signal form of the analog sampling signal as well as the interpolated, incremental measurement signal at various interpolation factors which are available according to the present invention.

The switching time point $t_u$ should be selected such that the incremental measurement signals have an identical signal form for each possible interpolation factor I, for example, a rising signal edge. This is illustrated in FIG. 2, which shows, in addition to the two analog sampling signals SIN and COS, the interpolated, incremental measurement signals in the output channels A and B and reference signals for different interpolation factors. At the selected switching time point $t_u$, the incremental measurement signal in channel B always displays a rising signal edge, that is, a change of the logical signal level from LOW to HIGH. Thus, the interpolated, incremental measurement signals display the same signal form for all interpolation factors, I, between which a switch is possible. Depending on the selection of the interpolation factors, the incremental measurement signals can also display another position with respect to its phase angle. It is important, however, that $t_u$ be selected so that at this point in time all possible interpolated, incremental measurement signals have an identical signal form. At this position in the waveform, the reference mark, REF, can also be active. If so, the interpolation electronics should condition the reference mark signal such that it also becomes active at time $t_u$ and for a period of one quarter of the interpolated output cycle as shown in FIG. 1. In the presently preferred embodiment, the reference mark signal becomes active low at time $t_u$ for a quarter of the interpolated output cycle.

A switch between the different interpolation factors I is possible only at switching time point $t_u$. This ensures that in measurement operation, the counting of the incremental measurement steps continues to be correct after the change has been made in interpolation factor I.

In addition to the selection of a suitable switching time point, the method and device according to the present invention also provide that switching between various interpolation factors is done by certain control signals, which will be described hereinafter. These measures should additionally ensure that changes take place correctly between various interpolation factors.

Referring back to FIG. 1, during each signal period of the analog sampling signals SIN and COS, a stabilizing interval with duration $t_H$ is always set up and is centered around the switching time point $t_u$. During this interval, no change is possible in the interpolation factor I. Therefore, within this interval, stable signal conditions are ensured inside the device according to the present invention and in the downstream evaluation unit 24 (FIG. 3). A corresponding stabilization interval signal H is sent by the device to the downstream evaluation unit 24. Thus, within the stabilization interval of duration $t_H$ for each signal period of the analog sampling signals SIN and COS, the signal level of the stabilization interval signal H is set from LOW to HIGH. In the remaining time of the signal period, during which a switch can take place in the interpolation factor I, the stabilization interval signal H has a level LOW. In the preferred embodiment shown in FIG. 1, the duration $t_H$ of the stabilization interval and its position in time at switching time point $t_u$ have been selected in such a way that it is always set up in a phase interval of 90° centered around switching time point $t_u$. Therefore, the stabilization interval begins at $\Phi=45°$ and ends at $\Phi=135°$ (as shown as outputs from the comparator 20 in FIG. 3). In principle, the duration and position of the stabilization interval relative to switching time point $t_u$ can be selected differently.

In order to activate or initiate a switch between the four different interpolation factors I=1, 2, 5, and 10, at least one additional activation signal is necessary. The activation signal can be sent, for example, from the user through a suitable input interface to the device according to the present invention. In the preferred embodiment shown in FIG. 1, two activation signals, RES1 and RES2, are provided for this purpose and can receive either a LOW or a HIGH level. The activation signals RES1 and RES2 and the combination of the appropriate signal levels at every given time encodes the specified interpolation factors between which a switch is possible during measurement operation. Thus, the signal level combination RES1=HIGH and RES2=HIGH encodes the interpolation factor I=10, RES1=LOW and RES2=LOW encodes interpolation factor I=1, RES1=HIGH and RES2=LOW encodes interpolation factor I=2, and RES1=LOW and RES2=HIGH encodes interpolation factor I=5. If switching is to be made possible between more than four specified interpolation factors I, activation signals must be provided in an analogous manner. Of course it will be appreciated that other alternative encodings are possible for the individual interpolation factors.

While the stabilization interval signal H is at the HIGH level, no change is possible in either of the two activation signals RES1 and RES2, that is, no switch can take place between the different interpolation factors during this time span. Changes in the interpolation factor are only possible when the stabilization interval signal is at the LOW level.

FIG. 1 shows the change in the two activation signals RES1 and RES2 as a function of time when switching from interpolation factor I=10 to I=1. At two points in time $t_{C_1}$ and $t_{C_2}$ the user switches the two activation signals RES1 and RES2. In the example shown the signal levels of both RES1 and RES2 are set from HIGH to LOW.

As soon as a change of either of the two activation signals RES1 or RES2 is recognized inside the device according to the present invention, it is clear that a desired switching in the interpolation factor I is about to take place. Therefore, a corresponding switch interval signal E is activated at time point $t_{C_1}$ by the device as an output signal. This signal indicates to the downstream evaluation unit that a change in the interpolation factor I is about to take place at the next possible point in time. For this purpose, the switching interval signal E is switched from logical signal level HIGH to LOW. The switching interval signal E is kept at signal level LOW until the switch takes place at time point $t_u$, and is switched back to HIGH after the switch in the interpolation factor I takes place. The downstream evaluation unit recognizes on the basis of such a sequence of signals in the switching interval signal E that a change is about to take place in the interpolation factor I and that the corresponding switching process is about to end, after which, incremental measurement signals will be available with the new interpolation factor. Therefore, such signal processing with the participation of the control signals mentioned ensures reliable switching between the various interpolation factors.

FIG. 3 shows a schematic block diagram of a device 26 according to a preferred embodiment of the present invention. This representation also marks the signal connections provided through which the control signals previously explained are transmitted during the switching process.

The device 26 includes a signal creation unit 10, differential amplifiers 12, processing unit 20, input interface 22 and evaluation unit 24. The processing unit 20 includes amplifier 15, reference generator 21, resistor ladder 14, comparator 16, reference mark comparators 17, decoder 18 and resolution synchronization logic 23.

Differential amplifiers 12a and 12b each receive two analog signal inputs, 180° and 0°; and 270° and 90°, respectively, from the signal creation unit 10. Differential amplifier 12c receives two reference signals REF⁻ and REF⁺ from the signal creation unit 10. Differential amplifier 12a outputs an analog sampling signal SIN to an amplifier 15, which creates the compliment of the SIN signal (denoted as 180° in FIG. 3) and forwards this signal to the resistor ladder 14. Differential amplifier 12a also outputs analog sampling signal SIN to the resistor ladder 14 directly. Differential amplifier 12b outputs an analog sampling signal COS to the resistor ladder 14. Differential amplifier 12c outputs a reference signal, REF to the reference mark comparators 17. Outputs from the resistor ladder 14 are fed to the comparator 20. Signals from the reference generator 21 are fed to the comparator 20 and the reference mark comparators 17. Outputs from the comparator 20 and reference mark comparators 17 are coupled to the decoder 18. The decoder 18 also receives inputs RES1 and RES2 from the input interface 22 via the resolution synchronization logic 23. The outputs of the decoder 18 are fed to the evaluation unit 24. The evaluation unit 24 can also receive input from the input interface 22.

The operation of the previously described components of the device 26 will now be described. The signal creation unit 10 supplies four analog sampling signals designated as 0°, 90°, 180°, and 270° to differential amplifiers 12a and 12b. These amplifiers combine the 0°, 180°, 90° and 270° signals in pairs to form the two analog sampling signals COS and SIN for further processing. Differential amplifier 12c combines the two signals REF⁻ and REF⁺ to form reference mark, REF. REF is then sent to the reference mark comparators 17 where it is compared with reference voltage SIG_REF generated by Reference Generator 21. If REF has a voltage greater than that of SIG_REF, reference mark comparators 17 outputs a signal CREF equal to a logic high. If REF has a voltage lower than that of SIG_REF, reference mark comparators 17 output CREF equal to a logic low. The signal HYS_REF generated by Reference Generator 21 is used to eliminate effects from noise on the REF signal.

Amplifier 15 takes the SIN signal from the output of amplifier 12a and provides the inverted form of SIN to the resistor ladder 14. The resistor ladder 14 also receives the SIN signal directly from amplifier 12a and the COS signal from amplifier 12b. The resistor ladder 14 is made in a known manner and creates a multitude of out-of-phase partial signals. Specifically, the function of the resistor ladder 14 is to accept two 90° phase shift signals and subdivide them into many subphase shifted signals. This is accomplished with a series of ratio resistor pairs that create a phase shifted summing junction. For 10X interpolation the ratio pairs are setup to provide a phase shifted signal every 9°. Each of the 20 signals created by the resistor ladder 14 are fed to comparator 16. The comparator 16 translate the inputted analog signals from the resistor ladder 14 to digital signals. The comparator 16 compares the analog signals to the reference voltage SIG_REF from the ref. gen. 21 and converts any portion of the signals above the reference to a logic high and any portion below to a logic low. A small amount of hysteresis HYS_REF from the ref. gen. 21 is included with each transition to eliminate effects from noise on the analog signals.

The 20 digital signals from the comparator 20 along with the signal CREF from the reference mark comparators 17 are fed into a decoder 18 where further signal processing and the selection and setting of the corresponding interpolation factor take place. Also fed into the decoder 18 are activation signals RES1 and RES2. In particular, unsynchronized resolution signals RES1 and RES2 are sent from the input interface 22 to resolution synchronization logic 23 where they are synchronized and fed to the decoder 18. The input interface 22 can be implemented in the form of a keyboard, for example, or in the form of switches, through which the user can select the specified interpolation factors. It is possible to use an input interface which is connected with evaluation unit 24, which is indicated by the dashed line connecting the input interface 22 with the evaluation unit 24.

In the presently preferred embodiment, RES1 and RES2 are synchronized so that the decoder unit 18 will not switch to a new interpolation factor until the zero crossing of the COS signal (as shown in FIG. 1). The decoder 18 combinationally joins particular phase shifted signals from the comparator 16 to create the quadrature output signal. The manner in which these signals are combined for the 1X/2X/5X/10X chip (decoder 18 in FIG. 3) is as follows:

|     | Channel A   | Channel B      | Phased Reference Mark (Reference Mark active and phase selected) |
| --- | ----------- | -------------- | ---------------------------------------------------------------- |
| 1X  | 0°          | 90°            | 90°–180°                                                         |
| 2X  | 45°–135°    | 90°–270°       | 90°–135°                                                         |
|     | 225°–315°   | 180°–360° (0°) |                                                                  |
| 5X  | 0°–180°     | 18°–198°       | 90°–108°                                                         |
|     | 36°–218°    | 54°–234°       |                                                                  |
|     | 72°–252°    | 90°–270°       |                                                                  |
|     | 108°–288°   | 126°–306°      |                                                                  |
|     | 144°–324°   | 162°–342°      |                                                                  |
| 10X | 9°–189°     | 0°–180°        | 90°–99°                                                          |
|     | 27°–207°    | 18°–198°       |                                                                  |
|     | 45°–225°    | 36°–218°       |                                                                  |
|     | 63°–243°    | 54°–234°       |                                                                  |
|     | 81°–261°    | 72°–252°       |                                                                  |
|     | 99°–279°    | 90°–270°       |                                                                  |
|     | 117°–297°   | 108°–288°      |                                                                  |
|     | 135°–315°   | 126°–306°      |                                                                  |
|     | 153°–333°   | 144°–324°      |                                                                  |
|     | 171°–351°   | 162°–342°      |                                                                  |

The signals from the decoder 18 are routed through suitable signal connections A, $\overline{A}$, B, $\overline{B}$, REF and $\overline{REF}$ to the downstream evaluation unit 24, for example, to the control system of a machine tool. Two additional signal connections are provided between the processing unit 20 and the evaluation unit 24. The stabilization interval signal H, previously described, is transmitted from the comparator 16 to the evaluation unit 24. The switching interval signal E, also previously described, is transmitted from the resolution synchronization logic 23 to the evaluation unit 24. In the presently preferred embodiment, when E goes low, a change in the interpolation factor has been requested. When E goes high, a change in the interpolation factor has occurred.

The device 26 according to the present invention can be made in different ways. For example, it is advantageous to make processing unit 20 in an integrated form as an application specific integrated circuit (ASIC) which has corresponding inputs and outputs. The ASIC made in this manner can in turn be assigned to the actual position measurement system.

In addition to the described implementation of the method and device according to the present invention, there exists other possible implementations based on the present invention. For example, the signal creation is not limited in any way to photoelectric sampling of a grating pitch, but rather magnetic, inductive or capacitive measurement systems can also be used in connection with the method and device according to the present invention. It is therefore intended that the foregoing detailed description be regarded as illustrative rather than limiting and that it be understood that it is the following claims, including all equivalents, which are intended to define the scope of this invention.

What is claimed is:

1. A method for varying an interpolation factor of at least one position-dependent, periodic signal in a position measurement system, the method comprising the steps of:
   transmitting an activation signal from an input interface to a processing unit wherein the activation signal initiates a change of the active interpolation factor to a new interpolation factor;
   transmitting a control signal from the processing unit to an evaluation unit wherein the control signal indicates that the active interpolation factor will be changed; and
   switching between the active interpolation factor and the new interpolation factor at a switching time point $t_u$ at which an interpolated measurement signal has an identical signal form for every possible interpolation factor.

2. The method according to claim 1 wherein the periodic interpolated signal has a rising signal edge at switching time point $t_u$.

3. The method according to claim 1 wherein the interpolation factor is varied during measurement operation of the position measurement system.

4. The method according to claim 1 further comprising the step of defining a stabilization interval of defined duration $t_H$ before and after the switching time point $t_u$ of every signal period, during which no change is possible in the interpolation factor.

5. The method according to claim 4 wherein the duration $t_H$ of the stabilization interval is equal to a phase angle of 90° of the periodic signal and is centered around the switching time point $t_u$.

6. The method according to claim 4 wherein a stabilization interval signal H is transmitted to an evaluation unit during the stabilization interval $t_H$.

7. The method according to claim 1 further comprising the steps of:
   defining a stabilization interval of defined duration before and after the switching time point $t_u$ of every signal period during which no change is possible in the interpolation factor wherein the stabilization interval is equal to a phase angle of 90° of the periodic signal and is a centered around a switching time point $t_H$ which is selected by a rising edge of the interpolated signal wherein it is possible to switch between the specified number of interpolation factors.

8. The method according to claim 5 wherein it is possible to switch between interpolation factors I=1, 2, 5, and 10.

9. The method according to claim 1, wherein switching between various interpolation factors is initiated by at least one activation signal from a user.

10. The method according to claim 9, further comprising the step of providing two activation signals which can be switched between two discrete levels, and which uniquely identify one of four selectable interpolation factors depending on the combination of the two levels.

11. The method according to claim 9 further comprising the steps of providing a defined switching interval signal in the time span between the initiation of the switching and the switching time point $t_u$.

12. The method according to claim 1 in which the step of switching between the different interpolation factors at a switching time point $t_u$ comprises the steps of:
   providing a stabilization interval which is limited in time in every signal period and is centered around the possible switching time point $t_u$;
   initiating a change of the active interpolation factor to a new interpolation factor by an activation signal;
   activating a switching interval signal H simultaneously with the activation signal;
   using the new interpolation factor from the next possible switching time point $t_u$;
   deactivating the switching interval signal after a switching has taken place to the new interpolation factor.

13. A device for varying the interpolation factor of a least one position-dependent periodic signal which is supplied by a signal creation unit of a position measurement system, wherein the signal is further processed in a processing unit, and is routed to a downstream evaluation unit, the device comprising:

at least one input interface, which is connected to the processing unit through one or several connection lines and through which an activation signal can be transmitted in the direction of the processing unit wherein the activation signal initiates a change of the active interpolation factor to a new interpolation factor; and at least one connection between the evaluation unit and the processing unit through which at least one control signal can be transmitted in the direction of the evaluation unit, which indicates that the actual interpolation factor will be changed.

14. The device according to claim 13 wherein the at least one control signal is a switching interval signal that indicates a time span $t_H$ between the initiation of a switch and a switching time point $t_u$.

15. The device according to claim 13, further comprising a connection between the evaluation unit and the processing unit through which a stabilization interval signal which is active during every signal period, is transmitted from the processing unit to the evaluation unit, and which gives the duration $t_H$ of a stabilization interval, which is always set up before and after the possible switching time point $t_u$, and during which no change is possible in the interpolation factor.

16. The device according to claim 13, wherein the processing unit is made in an integrated form as an ASIC.

17. The device according to claim 13, wherein the processing unit includes a resistor ladder unit arranged on the input side, a downstream comparator unit, and a decoder unit downstream from the comparator unit.

18. The device according to claim 17, wherein switching between the various interpolation factors takes place inside the decoder unit.

19. A method for varying an interpolation factor of at least one position-dependent, periodic signal in a position measurement system, the method comprising the steps of:

transmitting an activation signal from an input interface to a processing unit wherein the activation signal initiates a change of the active interpolation factor to a new interpolation factor;

transmitting a control signal from the processing unit to an evaluation unit wherein the control signal indicates that the active interpolation factor will be changed; and switching between the active interpolation factor and the new interpolation factor at a switching time point $t_u$ at which an interpolated measurement signal has an identical signal form for every possible interpolation factor, wherein the periodic interpolated signal has a rising signal edge at switching time point $t_u$.

20. A method for varying an interpolation factor of at least one position-dependent, periodic signal in a position measurement system, the method comprising the steps of:

transmitting an activation signal from an input interface to a processing unit wherein the activation signal initiates a change of the active interpolation factor to a new interpolation factor;

transmitting a control signal from the processing unit to an evaluation unit wherein the control signal indicates that the active interpolation factor will be changed; and switching between the active interpolation factor and the new interpolation factor at a switching time point $t_u$ at which an interpolated measurement signal has an identical signal form for every possible interpolation factor, defining a stabilization interval of defined duration $t_H$ before and after the switching time point $t_u$ of every signal period, during which no change is possible in the interpolation factor.

21. The method according to claim 20 wherein the duration $t_H$ of the stabilization interval is equal to a phase angle of 90° of the periodic signal and is centered around the switching time point $t_u$.

22. The method according to claim 20 wherein a stabilization interval signal H is transmitted to an evaluation unit during the stabilization interval $t_H$.

23. The method according to claim 20 wherein it is possible to switch between interpolation factors I=1, 2, 5 and 10.

24. A method for varying an interpolation factor of at least one position-dependent, periodic signal in a position measurement system, the method comprising the steps of:

transmitting an activation signal from an input interface to a processing unit wherein the activation signal initiates a change of the active interpolation factor to a new interpolation factor;

transmitting a control signal from the processing unit to an evaluation unit wherein the control signal indicates that the active interpolation factor will be changed; and switching between the active interpolation factor and the new interpolation factor at a switching time point $t_u$ at which an interpolated measurement signal has an identical signal form for every possible interpolation factor, defining a stabilization interval of defined duration before and after the switching point $t_u$ of every signal period during which no change is possible in the interpolation factor wherein the stabilization interval is equal to a phase angle 90° of the period signal and is centered around a switching time point $t_u$ which is selected by a rising edge of the interpolated signal wherein it is possible to switch between the specified number of interpolation factors.

25. A method for varying an interpolation factor of at least one position-dependent, periodic signal in a position measurement system, the method comprising the steps of:

transmitting an activation signal from an input interface to a processing unit wherein the activation signal initiates a change of the active interpolation factor to a new interpolation factor;

transmitting a control signal from the processing unit to an evaluation unit wherein the control signal indicates that the active interpolation factor will be changed; and switching between the active interpolation factor and the new interpolation factor at a switching time point $t_u$ at which an interpolated measurement signal has an identical signal form for every possible interpolation factor, wherein switching between various interpolation factors is initiated by at least one activation signal from a user.

26. The method according to claim 25 further comprising the step of providing two activation signals which can be switched between two discrete levels, and which uniquely identify one of four selectable interpolation factors depending on the combination of the two levels.

27. The method according to claim 25 further comprising the step of providing a defined switching interval signal in the time span between the initiation of the switching and the switching time point $t_u$.

28. A method for varying an interpolation factor of at least one position-dependent, periodic signal in a position measurement system, the method comprising the steps of:

transmitting an activation signal from an input interface to a processing unit wherein the activation signal initiates a change of the active interpolation factor to a new interpolation factor;

transmitting a control signal from the processing unit to an evaluation unit wherein the control signal indicates that the active interpolation factor will be changed;

switching between the active interpolation factor and the new interpolation factor at a switching time point $t_u$ at which an interpolated measurement signal has an identical signal form for every possible interpolation factor, in which the step of switching between the active interpolation factor and the new interpolation factor at a switching time point $t_u$ comprises the steps of:

providing a stabilization interval which is limited in time in every signal period and is centered around the possible switching time point $t_u$;

initiating a change of the active interpolation factor to a new interpolation factor by an activation signal;

activating a switching interval signal H simultaneously with the activation signal;

using the new interpolation factor from the next possible switching time point $t_u$; and deactivating the switching interval signal after a switching has taken place to the new interpolation factor.

29. A device for varying the interpolation factor of at least one position-dependent periodic signal which is supplied by a signal creation unit of a position measurement system, wherein the signal is further processed in a processing unit, and is routed to a downstream evaluation unit, the device comprising:

at least one input interface, which is connected to the processing unit through one or several connection lines and through which an activation signal can be transmitted in the direction of the processing unit wherein the activation signal initiates a change of the active interpolation factor to a new interpolation factor; and at least one connection between the evaluation unit and the processing unit through which at least one control signal can be transmitted in the direction of the evaluation unit, which indicates that the actual interpolation factor will be changed, wherein the at least one control signal is a switching interval signal that indicates a time span $t_H$ between the initiation of a switch and a switching time point $t_u$.

30. The device according to claim 29 further comprising a connection between the evaluation unit and the processing unit through which a stabilization interval signal which is active during every signal period, is transmitted from the processing unit to the evaluation unit, and which gives the duration $t_H$ of a stabilization interval, which is always set up before and after the possible switching time point $t_u$, and during which no change is possible in the interpolation factor.

31. The device according to claim 29 wherein the processing unit is made in an integrated form as an ASIC.

32. The device according to claim 29 wherein the processing unit includes a resistor ladder unit arranged on the input side, a downstream comparator unit, and a decoder unit downstream from the comparator unit.

33. The device according to claim 32 wherein switching between the various interpolation factors takes place inside the decoder unit.

* * * * *

UNITED STATES PATENT AND TRADEMARK OFFICE
CERTIFICATE OF CORRECTION

PATENT NO. : 5,920,494
DATED : July 6, 1999
INVENTOR(S) : Robert Setbacken et al.

It is certified that error appears in the above-identified patent and that said Letters Patent is hereby corrected as shown below:

In the Claims

In claim 13, line 1, please "a least" to --at least--.

In claim 28, line 22, please change "anew" to --a new--.

Signed and Sealed this

Seventeenth Day of April, 2001

Attest:

NICHOLAS P. GODICI

Attesting Officer     Acting Director of the United States Patent and Trademark Office

UNITED STATES PATENT AND TRADEMARK OFFICE
CERTIFICATE OF CORRECTION

PATENT NO.     : 5,920,494
DATED          : July 6, 1999
INVENTOR(S)    : Robert Setbacken et al.

It is certified that error appears in the above-identified patent and that said Letters Patent is hereby corrected as shown below:

<u>Title page,</u>
Item [73], immediately after "Calif." insert -- ; Acu-Rite, Inc., Jamestown, New York --.

Signed and Sealed this

Twenty-first Day of January, 2003

JAMES E. ROGAN
*Director of the United States Patent and Trademark Office*